United States Patent
Takayama

(10) Patent No.: US 7,141,861 B2
(45) Date of Patent: Nov. 28, 2006

(54) SEMICONDUCTOR DEVICE AND MANUFACTURING METHOD THERE

(75) Inventor: Makoto Takayama, Nitta-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/045,581

(22) Filed: Jan. 31, 2005

(65) Prior Publication Data

US 2005/0199978 A1    Sep. 15, 2005

(30) Foreign Application Priority Data

Mar. 9, 2004    (JP)    ............................ 2004-065980

(51) Int. Cl.
*H01L 29/47*    (2006.01)

(52) U.S. Cl. .............. 257/485; 257/771; 257/528; 257/280; 257/E29.338; 438/534; 438/582; 438/570

(58) Field of Classification Search ............ 257/155, 257/453, 771, 485–486, 281–284
See application file for complete search history.

(56) References Cited

U.S. PATENT DOCUMENTS

| 5,747,361 | A | * | 5/1998 | Ouellet | .................. | 438/643 |
| 5,789,311 | A | * | 8/1998 | Ueno et al. | .................. | 438/573 |
| 2003/0040144 | A1 | * | 2/2003 | Blanchard et al. | .......... | 438/145 |
| 2004/0072009 | A1 | * | 4/2004 | Segal et al. | ................. | 428/561 |

FOREIGN PATENT DOCUMENTS

JP    06-224410    8/1994

* cited by examiner

*Primary Examiner*—Jerome Jackson
*Assistant Examiner*—Paul Budd
(74) *Attorney, Agent, or Firm*—Morrison & Foerster LLP

(57) ABSTRACT

A problem in related art according to which an increase in leak current cannot be avoided in order to obtain a low forward voltage VF as forward voltage VF and reverse leak current IR characteristics of a Schottky barrier diode are in a trade-off relationship is hereby solved by forming a Schottky barrier diode using a metal layer comprising a Schottky metal layer of Ti including a small amount of Al. Consequently, a low reverse leak current IR can be obtained without causing a large increase in the forward voltage VF of pure Ti such that power consumption can be reduced by suppressing forward power loss and decreasing reverse power loss.

4 Claims, 4 Drawing Sheets

SEMICONDUCTOR DEVICE AND MANUFACTURING METHOD THERE

BACKGROUND OF THE INVENTION

Field of the Invention

The present invention relates to a semiconductor device and a manufacturing method thereof, and more in particular to a semiconductor device having a low reverse leak current IR while suppressing a forward voltage VF of a Schottky barrier diode, and to a manufacturing method thereof, respectively.

A Schottky barrier diode is a semiconductor element using rectification of a Schottky barrier formed when a predetermined metal layer comes in contact with a semiconductor layer. A Schottky barrier diode enables high-speed operation characterized by a smaller drop in the forward voltage VF than that of a general PN junction.

When a metal layer and a semiconductor substrate having different work functions come into contact with each other, their energy bands are modified so that the Fermi levels thereof become coincident with each other, thereby generating a Schottky barrier therein. The height of the barrier, in other words, the difference in work function (in the present specification, the difference in work function will be hereinafter represented by øBn) is a factor for determining the characteristics of a Schottky barrier diode. øBn is a value inherent to metal.

As shown in FIG. 5, when a negative voltage is applied to an N+ type semiconductor substrate 1 of a Schottky barrier diode D2 and a positive voltage is applied to a Schottky metal layer 13 formed on an N– type epitaxial layer 2, current flows therethrough; the current that flows at this time being a forward current IF and the voltage being a forward voltage VF. On the other hand, when the voltage application direction is inverted such that a positive voltage is applied to the N+ type semiconductor substrate 1 and a negative voltage is applied to the Schottky metal layer 13, there is almost no current flowing. A leak current at this time is hereinafter referred to as a reverse leak current IR, while the voltage is called a reverse voltage VR.

In case of certain types of Schottky barrier diodes, the forward voltage VF thereof is low if the øBn is small, but the reverse leak current IR during reverse voltage VR increases. Accordingly, the forward voltage VF and the reverse leak current IR are in a trade-off relationship.

FIG. 5 shows a conventional Schottky barrier diode D2. FIG. 5A is a plan view and FIG. 5B is a cross-sectional view taken along a line B—B of the FIG. 5A. In the plan view 5A, a Schottky metal layer 13, an anode electrode 7 and an insulating layer 5 are omitted.

The substrate comprises the N+ type semiconductor substrate 1 and the N– type semiconductor layer 2 laminated by epitaxial growth on the semiconductor substrate 1, for example. The Schottky metal layer 13 for forming a Schottky junction is provided on a surface of the N– type epitaxial layer 2. The Schottky metal layer 13 can comprise for instance Mo and the region where the Schottky metal layer 13 and the N– type epitaxial layer 2 come in contact with each other is referred to as the Schottky junction area.

A guard ring area 4 is provided at the periphery of the Schottky junction area by diffusing P+ type impurities to secure a predetermined breakdown voltage, such that a portion thereof comes in contact with the Schottky metal layer 13.

An anode electrode 7 comprising Al, etc. is provided so as to cover the entire surface of the Schottky metal layer 13 and a cathode electrode 8 is formed on a rear surface of the substrate (see Japanese Laid-Open Patent Application No. Hei 6-224410). An insulating film 5 comprising a Si oxide film is also provided on the epitaxial layer 2.

In recent years, efforts have been made to reduce the forward voltage VF of the Schottky barrier diode to hereby obtain low power consumption.

One of the methods for reducing the forward voltage VF is to use, for the Schottky metal layer, a type of metal having a low work coefficient øBn, however, in this case, the reverse leak current IR increases.

A second method is to increase the contact area between the Schottky metal layer and the epitaxial layer, thus inevitably enlarging the size of the element itself and causing an increase in the reverse leak current IR in proportion to the contact area.

Thirdly, a reduction in the thickness of the epitaxial layer so as to reduce resistance and further a reduction of the forward voltage VF cause a drop in breakdown voltage.

As a fourth method, the resistivity can be reduced by increasing the concentration of the impurities of the epitaxial layer 3 to thereby reduce the forward voltage VF, but in this case, the breakdown voltage may decrease, the spread of the depletion layer of the Schottky junction portion may become smaller and the capacity may increase such that high-speed operation of the Schottky barrier diode is impeded.

SUMMARY OF THE INVENTION

The present invention is made in view of the above-described and/or other problems existing in the background art and the preferred embodiments provide a semiconductor device having a one-conductivity type semiconductor layer and a metal layer forming a Schottky junction with a surface of the semiconductor layer, wherein the metal layer is formed of an alloy comprising Schottky metal and a small amount of Al.

Furthermore, another aspect of the embodiments is that the semiconductor layer is an epitaxial layer formed on a semiconductor substrate.

Another aspect of the embodiments is to provide a semiconductor device comprising a one-conductivity type semiconductor substrate, a one-conductivity type semiconductor layer formed on the semiconductor substrate and a metal layer forming a Schottky junction with a surface of the semiconductor layer, wherein the metal layer is formed of a Schottky metal which comprises a small amount of Al.

In addition, the Schottky metal can also comprise Ti.

Another aspect of the embodiments is that a concentration of the Al can be in the range of about 0.05 wt. % to 0.5 wt. %.

Further, some preferred embodiments provide a manufacturing method comprising at least preparing an alloy comprising Ti and Al having a concentration in the range of about 0.05 wt. % to 0.5 wt. %, and a semiconductor substrate having a portion of a semiconductor layer exposed; and forming, on the semiconductor substrate, a thin film comprising the alloy.

The reverse leak current IR can be thereby decreased while suppressing the forward voltage VF of the Schottky barrier diode and power consumption can be reduced by reducing reverse power loss while suppressing forward power loss.

Epitaxial layer thickness and impurity concentration are the same as those used in the background art, such that there is no decrease in the breakdown voltage or operation speed.

DESCRIPTION OF THE PREFERRED EMBODIMENTS

Preferred embodiments of the present invention are next described with reference to FIG. 1 to FIG. 4. While some exemplary embodiments are described, these illustrative embodiments are merely exemplary and do not limit the broad scope of the invention.

Figure 1A:
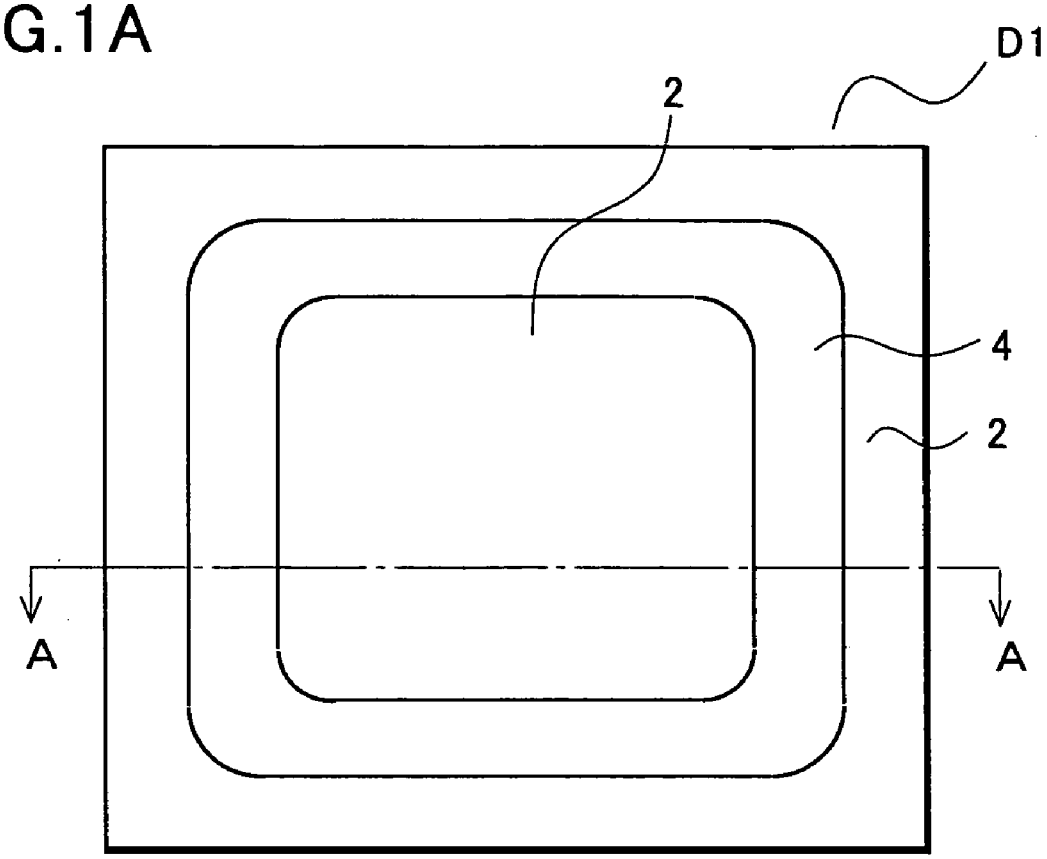
FIG. 1A is a plan view and FIG. 1B is a cross-sectional view for illustrating a semiconductor device according to some embodiments of the invention.
Figure 1B:
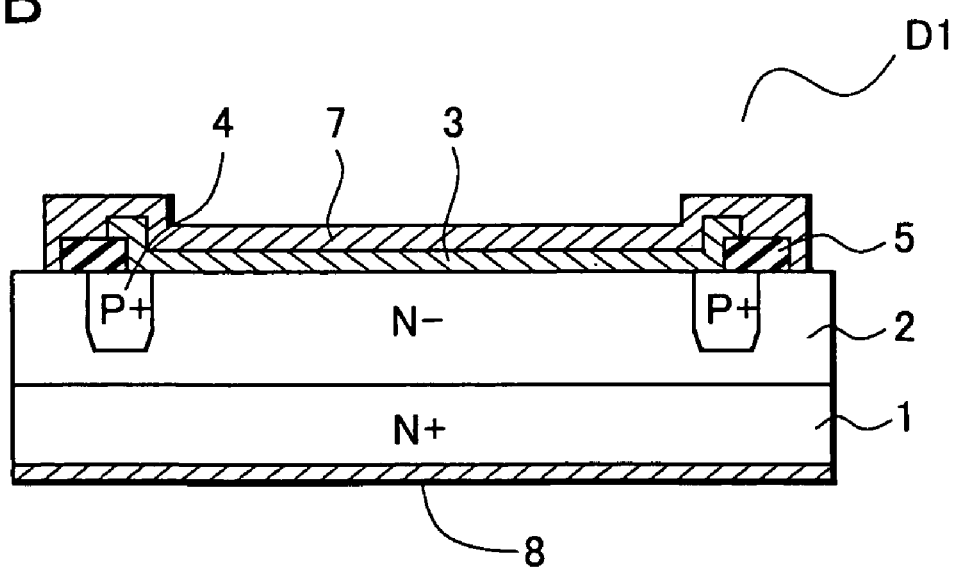

FIG. 1 shows a Schottky barrier diode D1 according to an embodiment of the present invention. FIG. 1A is a plan view and FIG. 1B is a cross-sectional view taken along line A—A of FIG. 1A. In FIG. 1A, a metal layer 3, an anode electrode 7 and an insulating film 5 are omitted.

Figure 5A:
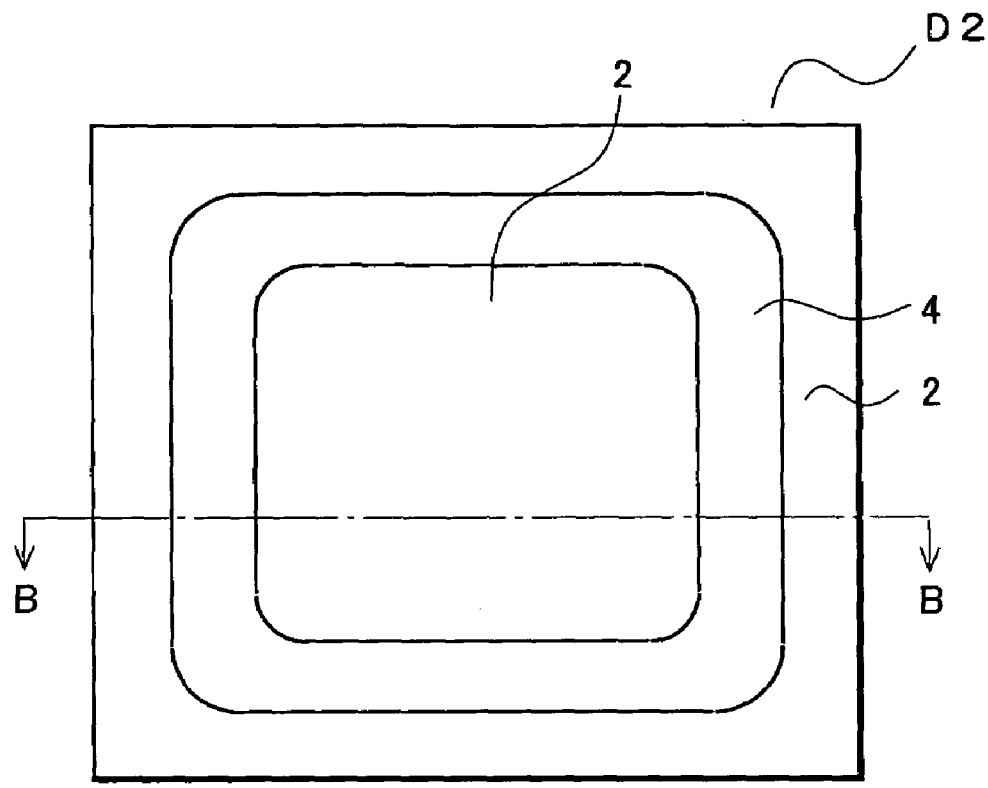
FIG. 5A is a plan view and FIG. 5B is a cross sectional view for illustrating a conventional semiconductor device.
Figure 5B:
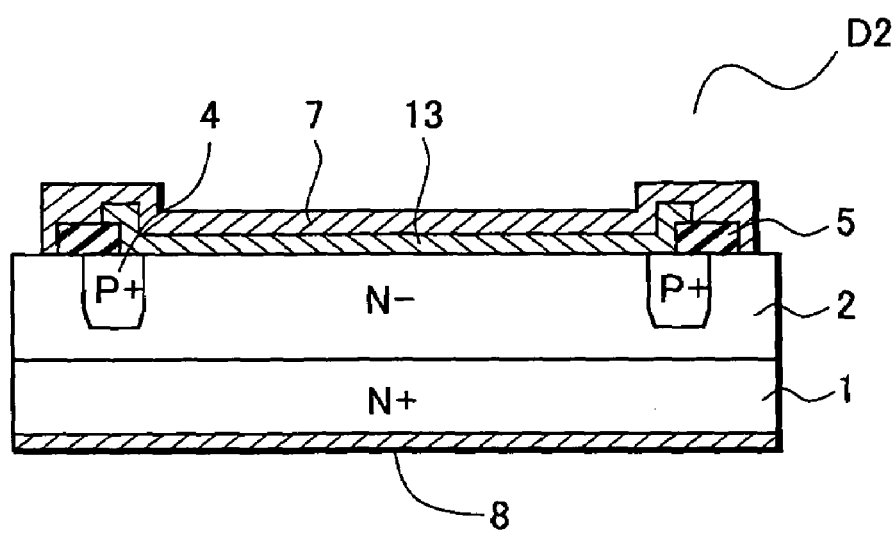

The Schottky barrier diode D1 of this embodiment comprises a one-conductivity type semiconductor substrate 1, a one-conductivity type semiconductor layer 2 and a Schottky metal layer 3 comprising a very small amount of Al. Elements which are identical to those described with reference to FIG. 5 will hereinafter be represented by the same numerical symbols.

The semiconductor substrate comprises an N+ type semiconductor substrate 1 and an N− type semiconductor layer 2 laminated by epitaxial growth, etc. on the semiconductor substrate 1.

A metal layer 3 forming a Schottky junction with a surface of the N− type semiconductor layer 2 is provided thereon. The Schottky metal layer 3 is preferably a layer comprising Ti and a very small amount of Al.

In conventional structures, a Schottky metal layer 13 (see FIG. 5B) comprises Ti, Cr, Mo or others which are pure Schottky metals, however, in the embodiments of this invention, a very small amount of Al is mixed with the Schottky metal layer 3.

Next, a description is going to be given about how a low reverse leak current IR can be obtained while suppressing a forward voltage VF of the Schottky barrier diode.

Moreover, preferably an Al layer serving as the anode electrode 7 is provided so as to cover the entire surface of the Schottky metal layer 3 and a cathode electrode 8 is also provided on a rear surface of the N+ type semiconductor substrate 1.

A guard ring area 4 formed by diffusing P+ type impurities for securing a breakdown voltage is formed in a periphery of the substrate such that a portion thereof comes in contact with the Schottky metal layer 3. A surface of an N− epitaxial layer 2 positioned inside the guard ring area 4 serves as a Schottky junction area.

Figure 2:
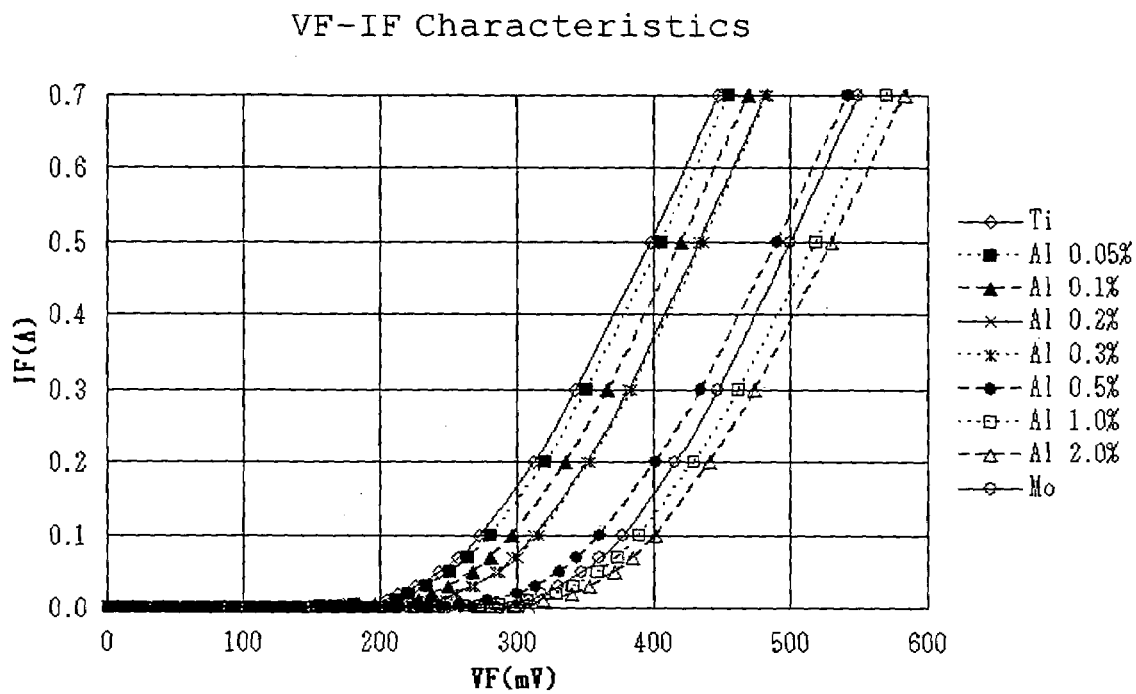
FIG. 2 is a characteristics diagram for comparing a conventional semiconductor device and a semiconductor device according to some embodiments of the invention.

FIG. 2 is a characteristics diagram comparing the Schottky barrier diode D1 of this preferred embodiment and a Schottky barrier diode D2 of the related art, showing the relationship between the forward voltage VF and the forward current IF in case the Shottky metal layer 3 and the Schottky metal layer 13 have different composition. In the Schottky barrier diode D1 of the preferred embodiment, the Schottky metal layer 3 is formed for example by EB (Electron Beam) evaporation. Seven Schottky metal layers 3 are formed from seven different ingots that contain Ti and Al. As shown in FIG. 2, the aluminum concentrations of the titanium based alloy were 0.05 wt. %, 0.1 wt. %, 0.2 wt. %, 0.3 wt. %, 0.5 wt. %, 1.0 wt. % and 2.0 wt. %. The VF-IF characteristic curve of the Schottky metal layer with Al of 0.05 wt. % is at the most left position among the seven curves of the seven Al-containing alloys, with the curve gradually shifting to the right with increasing amount of Ti. FIG. 2 also includes the two VF-IF characteristic curves for the two Schottky metal layers 13 corresponding to pure Ti and pure Mo. The one with pure Ti is located further left from the one with 0.05 wt. % Al, and the one with pure Mo is located between 0.5 wt. % Al and 1.0% Al.

The forward voltage VF increases with the increase of the amount of Al mixed with the Ti, such that in case of an amount of Al having a concentration of 1.0 wt. %, the forward voltage VF is larger than in case of pure Mo. For example, if the forward current IF is 500 mA, the forward voltage VF is 400 mV in case the schottky barrier diode D2 comprising pure Ti, the VF is 420 mV in case the Schottky barrier diode D1 comprising Al in a concentration of 0.1 wt. % mixed with the Ti, the VF is 490 mV if 0.5 wt. % of Al is mixed therewith, the VF is 520 mV if 1.0 wt. % of Al is mixed therewith. In this manner, the VF of Shottky barrier diode D1 exceeds the VF of pure Mo which is 500 mV, if 1.0 wt. % of Al is mixed therewith.

Figure 3:
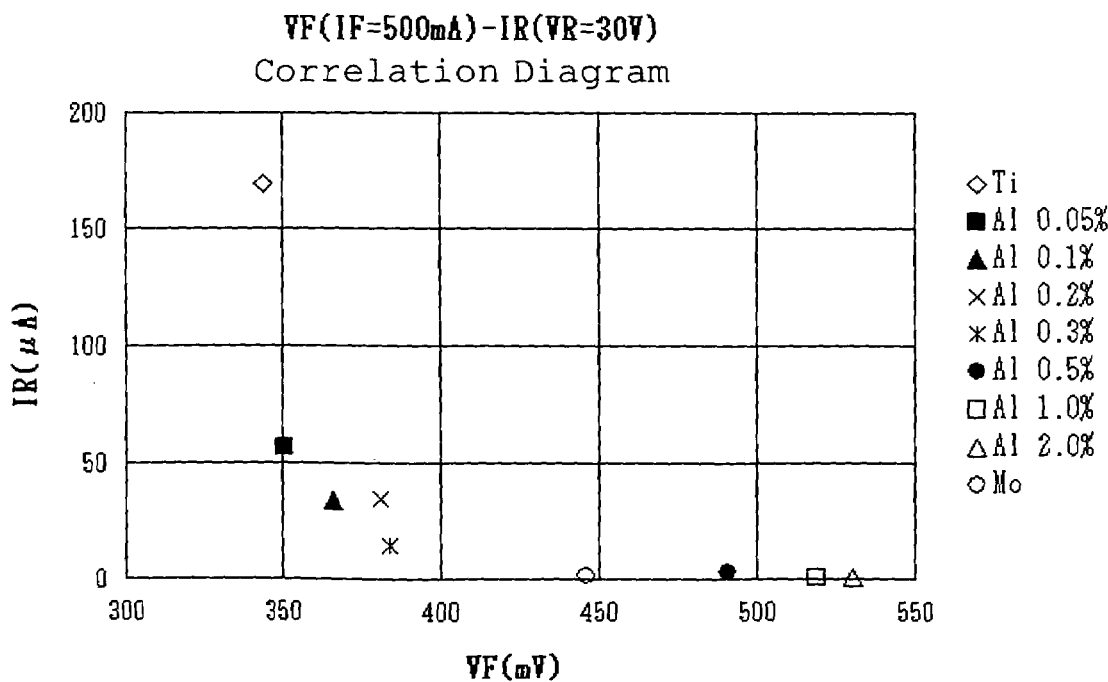
FIG. 3 is a characteristics diagram for comparing a conventional semiconductor device and a semiconductor device according to some embodiments of the invention.

FIG. 3 is a characteristics diagram comparing the Schottky barrier diode D1 and the Schottky barrier diode D2. As with FIG. 2, the Shottky metal layer 3 and the Schottky metal layer 13 have different composition. FIG. 3 shows the relationship between the forward voltage VF when the forward current IF is 500 mA and the reverse leak current IR when the reverse voltage VR is 30V. In the Schottky barrier diode D1, the Schottky metal layer 3 is formed for example by EB (Electron Beam) evaporation. The seven Schottky metal layers 3 of the Ti/Al alloys and the layers 3 of pure Ti and pure Mo are the same as described above.

The reverse leak current IR decreases drastically with the increase of Al mixed with the Ti, but the forward voltage VF does not increase much such that in case the concentration of Al is equal to or above 0.5 wt. %, the forward voltage VF becomes larger than in case of pure Mo. In the diagram, the reverse leak current IR in case of pure Ti is 169 μA, the forward voltage VF is 344 mV. On the other hand, in case of the Schottky barrier diode of this embodiment, if Al in a concentration of 0.05 wt. % is mixed with Ti, the reverse leak current IR is 57 μA, decreasing 66%, whereas the forward voltage VF is 351 mV, increasing only 2%. When 0.1 wt. % of Al is mixed with Ti, the reverse leak current IR is 34 μA, decreasing 80%, whereas the forward voltage VF is 366 mV, increasing only 6%. When 0.3 wt. % of Al is mixed with Ti, the reverse leak current IR is 15 μA, decreasing 91%, whereas the forward voltage VF is 384 mV, increasing only 12%. When 0.5 wt. % of Al is mixed with Ti, the reverse leak current IR is 3 μA, decreasing 98%, whereas the forward voltage VF is 490 mV, increasing 42%.

As described in the above embodiment, the Schottky barrier diode D1 can be formed by the Schottky metal layer 3 which is a Schottky metal comprising Ti mixed with Al having a concentration in the range from about 0.05 wt. % to 0.5 wt. %. Thereby the reverse leak current IR can be decreased without causing a large increase of the forward voltage VF of pure Ti. Therefore, reducing power consumption can be obtained by suppressing forward power loss and reducing reverse power loss.

Furthermore, the Schottky barrier diode D1 can be formed by the Schottky metal layer 3 which is the Schottky metal comprising Ti mixed with Al having a concentration in the range of from about 0.05 wt. % to 0.5 wt. % to thereby obtain a characteristic (the forward voltage VF and the reverse leak current IR) between a Schottky barrier diode formed of a metal layer comprising pure Ti and a Schottky barrier diode formed of a metal layer comprising pure Mo. Based on this, a characteristic can be obtained for the Schottky barrier diode according the intended application thereof.

In the embodiment of the present invention, the contact area between the Schottky metal layer 3 and the epitaxial layer 2 is not increased compared to related art, and in consequence the size of the element is not modified.

Furthermore, since there is no need to lower resistance by reducing thickness of the epitaxial layer 2 and to lower resistivity by increasing concentration of impurities, the breakdown voltage does not deteriorate. Moreover there is no increase in capacity of the Schottky barrier diode by a smaller spread of the depletion layer of the Schottky junction portion. Accordingly, high-speed operation of the Schottky barrier diode is not impeded.

In the above embodiment, the Schottky barrier diode is formed by a metal layer comprising Ti which is a Schottky metal to which a very small amount of Al is added, however, according to the intended application for the Schottky barrier diode, it is possible to obtain a desired characteristic by selecting another Schottky metal and varying the concentration of the added Al amount.

In addition to forming a Schottky metal layer by using a metal layer comprising a Schottky metal to which a very small amount of Al was added, it is possible to combine a method of increasing the contact area between the Schottky metal layer 3 and the epitaxial layer 2 and a method of thinning the epitaxial layer 2 or increasing the concentration of impurities of the epitaxial layer 2.

Also, in the above embodiment, the N− type semiconductor layer 2 is laminated on the N+ type semiconductor substrate 1 and a Schottky barrier diode having a metal layer 3 comprising preferably Ti and a very small amount of Al mixed therewith is formed on a surface of the N− type semiconductor layer 2, however, the N− type semiconductor layer can be formed on a P type semiconductor substrate forming an IC, and a Schottky barrier diode element can be formed by providing a metal layer comprising Ti, for instance, and having a small amount of Al mixed therewith on a surface of the N− type semiconductor layer.

Figure 4A:
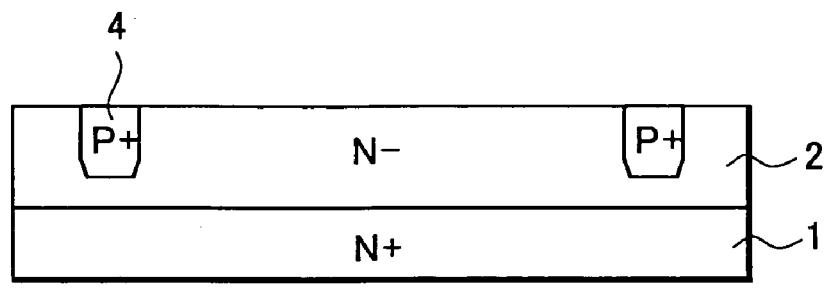
FIG. 4 is a cross sectional view for showing a manufacturing method of a semiconductor device according to another embodiment of the present invention.
Figure 4B:
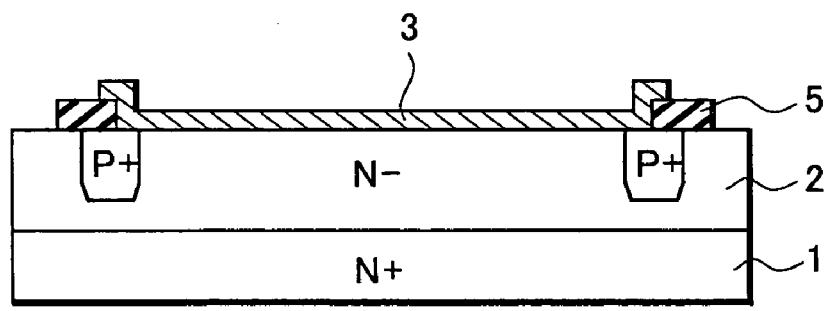

Next, a manufacturing method of a Schottky barrier diode D1 of the present embodiment is described with reference to FIG. 4.

First, an N− type semiconductor layer 2 is laminated by epitaxial growth, etc. on an N+ type semiconductor substrate 1 and an insulating film such as an oxide film (not illustrated) is formed on the entire surface. An opening is formed in the oxide film only around a predetermined Schottky junction area in order to secure a predetermined breakdown voltage, after which a high concentration impurity area 4 is formed by implanting and diffusing P+ type impurities around a surface of the N− type semiconductor layer 2. The high concentration impurity area 4 functions as a circular P+ type guard ring area 4. (see FIG. 4 A)

Next, an oxide film 5 which covers a surface of a epitaxial layer 2 is removed to thereby form an opening and a Schottky metal layer 3 is evaporated around 0.2 μm thick which comprises a Schottky metal such as Ti to which a small amount of Al is added on a surface of the epitaxial layer 2 and on a portion of the guard ring area 4 and then, a heat treatment is carried out at preferably 450° C. to 600° C. for silicidation. This process leads to the formation of a Schottky junction between the epitaxial layer 2 and the Schottky metal layer 3. The øBn varies according to the Schottky metal layer 3 and the Schottky junction area such that the Schottky metal needs to be selected accordingly considering the chip size and the desired characteristics. (see FIG. 4B).

The Schottky metal layer 3 which is the Schottky metal such as Ti mixed with a small amount of Al is evaporated. In more detail, an ingot comprising Ti mixed with Al having a concentration of from around 0.05 wt. % to 0.5 wt. % is used to form the Schottky metal layer 3 by EB evaporation. The use of the Schottky metal layer 3 enables to lower the reverse leak current IR while suppressing the forward voltage VF of the Schottky barrier diode.

Figure 4C:
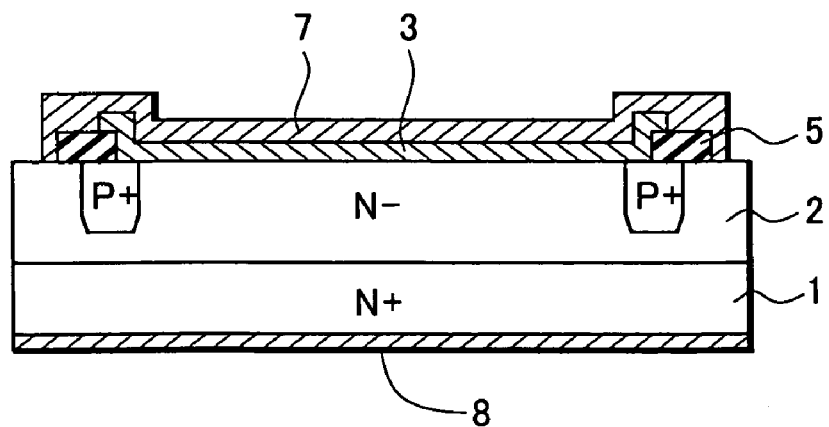

An Al layer of around 1.0 to 6.0 μm functioning as an anode electrode 7 is formed on the entire surface and a cathode electrode 8 comprising preferably Ti/Ni/Au, etc. is formed on a rear surface thereof in order to obtain the final structure shown in FIG. 4C.

What is claimed is:

1. A semiconductor device comprising:
   a semiconductor layer; and
   a metal layer forming a Schottky junction with a surface of the semiconductor layer and comprising titanium and aluminum,
   wherein a concentration of aluminum is from about 0.05% by weight to about 0.5% by weight of the metal layer.

2. The semiconductor device of claim 1, further comprising a semiconductor substrate, wherein the semiconductor layer comprises an epitaxial layer formed on the semiconductor substrate.

3. A semiconductor device comprising:
   a semiconductor substrate of a first conductivity type;
   a semiconductor layer of the first conductivity type that is formed on the semiconductor substrate; and
   a metal layer forming a Schottky junction with a surface of the semiconductor layer and comprising titanium and aluminum,
   wherein a concentration of aluminum is from about 0.05% by weight to about 0.5% by weight of the metal layer.

4. A method of manufacturing a semiconductor device, comprising:
   providing an alloy comprising titanium and aluminum and having an aluminum concentration of from about 0.05% by weight to about 0.5% weight of the alloy;
   providing a semiconductor substrate comprising a semiconductor layer that is at least partially exposed on a surface of the semiconductor substrate; and
   forming a thin film of the alloy on the semiconductor substrate so as to contact with the semiconductor layer.

* * * * *